US005315126A

United States Patent [19]

Field

[11] Patent Number: 5,315,126

[45] Date of Patent: May 24, 1994

[54] HIGHLY DOPED SURFACE LAYER FOR NEGATIVE ELECTRON AFFINITY DEVICES

[75] Inventor: Robert J. Field, Fincastle, Va.

[73] Assignee: ITT Corporation, New York, N.Y.

[21] Appl. No.: 959,679

[22] Filed: Oct. 13, 1992

[51] Int. Cl.[5] ............ H01L 29/34

[52] U.S. Cl. ............ 257/10; 257/11; 313/346 R; 313/368

[58] Field of Search ............ 257/11, 10; 313/366, 313/373, 384, 367, 368, 385, 346 R, 346 DC

[56] References Cited

U.S. PATENT DOCUMENTS

| | | | |
|---|---|---|---|
| 3,631,303 | 12/1971 | Antypas et al. | 257/10 |
| 3,699,404 | 10/1972 | Simon et al. | 257/11 |
| 4,099,198 | 7/1978 | Howorth et al. | 257/10 |
| 4,344,803 | 8/1982 | Kasper . | |
| 4,907,042 | 3/1990 | Tardella et al. | 257/10 |
| 5,029,963 | 7/1991 | Naselli et al. | 350/96.18 |
| 5,114,373 | 5/1992 | Peckman | 445/3 |

OTHER PUBLICATIONS

Kan et al, "New Structure GaP-GaAlP Heterojunction Cold Cathode," *IEEE Transaction on Electron Devices*, vol. ED-26, No. 11, Nov. 1979, pp. 1759-1766.

Milnes, *Semiconductor Devices and Integrated Electronics*, pp. 754-813, Van Nostrand Reinhold Co., N.Y. 1980.

*Primary Examiner*—William Mintel

*Attorney, Agent, or Firm*—Arthur L. Plevy; Patrick M. Hogan

[57] ABSTRACT

A negative electron affinity device has acceptor dopant concentration increased proximate the emitter face of the III-V semiconductor layer and within the depletion zone effected by an overlying CsO negative electron affinity coating. Methods to accomplish dopant concentration include diffusion, ion implantation and doping during crystal growth.

10 Claims, 1 Drawing Sheet

HIGHLY DOPED SURFACE LAYER FOR NEGATIVE ELECTRON AFFINITY DEVICES

FIELD OF THE INVENTION

The present invention relates to negative electron affinity devices, such as photocathodes and photomultiplier tubes and more particularly to such a device having a primary electron emitting layer composed of a semiconductor with a tailored concentration gradient of dopant and methods for producing same.

DESCRIPTION OF THE PRIOR ART

Negative electron affinity (NEA) devices such as vacuum tube photodetectors, photocathodes, photomultiplier tubes, and image intensifier tubes convert incoming photons into electrons, and then emit the electrons into vacuum, where they are accelerated by an electric field to increase their energy. The number of electrons are multiplied by secondary emitters. For negative electron affinity action a very thin (monolayer) of Cs or Cs:O is applied to the surface of a III-V semiconductor such as $In_xGa_{1-x}As$. The work function energy should be as small as the choice of the coating material will allow, and the processing should be such that the band bending is as large as possible.

Reflection mode NEA photocathodes have the light incident on the cathode vacuum surface as in photomultiplier tubes, whereas transmission mode photocathodes are thin film structures with the light incident from the rear as for image tubes. NEA action can also be achieved in p+Si. See a text entitled "SEMICONDUCTOR DEVICES AND INTEGRATED ELECTRONICS" by A. G. Milnes, chapter 13 entitled "LIGHT DETECTING SEMICONDUCTOR DEVICES," at page 783 in a section entitled NEGATIVE ELECTRON AFFINITY EMITTERS, published by Van Norstrand Reinhold Company, New York (1980).

In devices such as the Generation III image intensifier, a relatively thick (1-5 μm) semiconductor layer such as gallium arsenide (GaAs), indium phosphate (InP), gallium indium phosphate (GaInP) or other III-V compound is used for absorbing the photons to generate the primary electrons. The emitting surface of this semiconductor is coated with a relatively thin (0.001-0.002 μm) Negative Electron Affinity (NEA) coating such as cesium oxide (CsO). This helps create a depletion layer of intermediate thickness in the semiconductor near the emitting surface. The NEA coating also serves to create a more positively charged surface, so that electrons entering the depletion layer are accelerated toward the surface and thereby have a higher escape probability. The semiconductor matrix is typically doped with an electron acceptor such as zinc (Zn) to yield a P-type material. See U.S. Pat. No. 5,114,373 issued on May 19, 1992 entitled METHOD FOR OPTIMIZING PHOTOCATHODE PHOTO-RESPONSE to R. Peckman and assigned to ITT Corporation, the assignee herein. The patent discusses the fabrication of photocathodes using CsO layers. For descriptions of some differences between Generation II and Generation III image intensifier tubes, see U.S. Pat. No. 5,029,963 issued on Jul. 9, 1991 entitled REPLACEMENT DEVICE FOR A DRIVER VIEWER by C. Naselli et al., and assigned to ITT Corporation, the assignee herein.

In negative electron affinity devices, primary electrons will diffuse to the depletion layer if they are generated sufficiently close. The typical distance an electron will diffuse in the material is characterized by the diffusion length. The diffusion length depends on acceptor doping concentration. High doping levels reduce the diffusion length and the probability that an electron will reach the depletion layer, and thus decreases the photoresponse.

Once an electron reaches the depletion layer, it is accelerated toward the NEA coating. If the semiconductor has sufficiently low work function, and the NEA coating produces a depletion layer with sufficient potential, then the primary electrons can have enough energy to escape into the vacuum. The escape probability depends on the depletion layer thickness, which depends on the doping concentration. Low doping gives a thicker depletion layer, which increases the probability that an electron will collide, lose some of its kinetic energy and be unable to escape into the vacuum. This decreases photoresponse.

Thus there is a tradeoff in the doping concentration: high doping decreases photoresponse by degrading diffusion length, while low doping decreases photoresponse by reducing escape probability. In practice, a compromise value of doping is used.

it is therefore an object of the present invention to provide a negative electron affinity device having enhanced photoresponse.

It is a further object to provide improved photoresponse in a simple and economical manner.

SUMMARY OF THE INVENTION

The problems and disadvantages associated with the conventional techniques and devices utilized to convert electromagnetic radiation to a flow of electrons are overcome by the present invention which includes a negative electron affinity device with a semiconductor layer doped with an electron acceptor dopant. The semiconductor layer has an emitter face from which electrons are emitted. A coating of material to produce or enhance negative electron affinity is deposited over the semiconductor layer emitter face and sets up a depletion band within the semiconductor. Unlike conventional devices of this type, the present invention has a tailored doping profile in which the dopant is concentrated proximate the emitter face. In a corresponding method the enhanced concentration of dopant proximate the emitter face is achieved.

BRIEF DESCRIPTION OF THE FIGURES

For a better understanding of the present invention, reference is made to the following detailed description of an exemplary embodiment considered in conjunction with the accompanying drawings, in which.

DETAILED DESCRIPTION OF THE FIGURES

Figure 1:
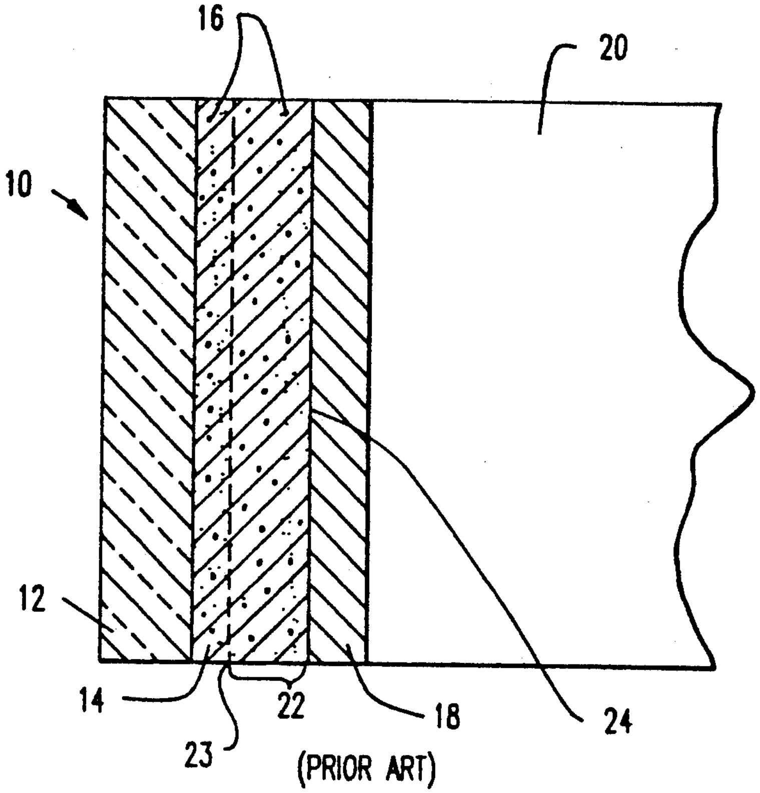
(PRIOR ART) FIG. 1
FIG. 1 is a schematic cross-sectional view of a negative electron affinity device in accordance with the prior art.

FIG. 1 shows a negative electron affinity device 10 in accordance with the prior art. The device has a transparent faceplate 12 which would typically be formed from glass, upon which is deposited or attached a semiconductor photon-to-electron conversion layer 14 comprised of, for example, gallium arsenide (GaAs). The semiconductor layer 14 is doped with a doping material 16, such as zinc (Zn) to yield a P-type material. A negative Electron Affinity (NEA) coating, such as cesium oxide (CsO) 18 is deposited over the GaAs layer 14. The area 20 immediately adjacent to the photocathode structure comprised of the GaAs layer 14 and CsO coating 18 is typically evacuated to permit the uninterrupted traversal of electrons to an electron multiplier, such as a microchannel plate (not shown). The Negative Electron Affinity (NEA) coating 18 creates an electron depletion layer 22 which is illustrated in FIG. 1 as starting at the dashed line 23 and ending at the emitter surface 24 of the semiconductor layer 14 which abuts the CsO layer 18. In known devices, the concentration of the doping particles 16 within the semiconductor layer matrix 14 is homogeneous, or perhaps even reduced near the emitter surface 24 due to dopant evaporation during processing. For this reason, the above-described tradeoff in doping concentration and photoresponse appertains in known devices.

The present invention calls for increasing the doping at the emitter surface 24 of the conversion layer 14, in particular, within the depletion layer 22. This shrinks the depletion layer 22 width without affecting diffusion in the bulk of the semiconductor layer 14. Conversely, the doping of the conversion layer 14 (with the exception of the depletion layer region 22), can be reduced for higher diffusion length without affecting escape probability. The increased doping concentration should be confined to the depletion layer 22 as much as possible. High acceptor concentrations outside the depletion layer 22 (and specifically a doping gradient) can cause diffusion of holes away from the depletion layer, which in turn sets up an electric field which tends to confine electrons to the conversion layer. This reduces the probability of electrons reaching the depletion layer.

Figure 2:
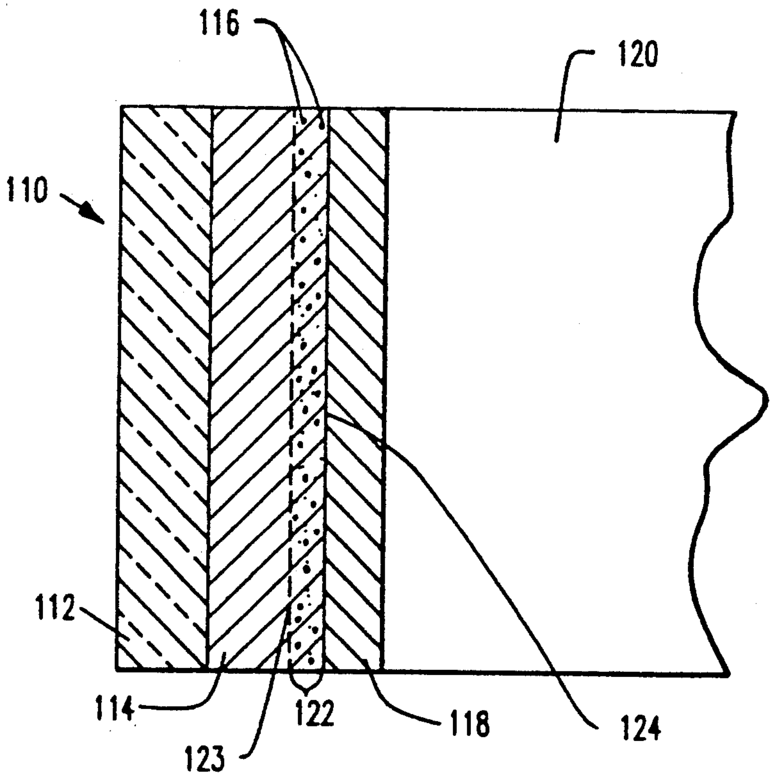
FIG. 2 is a schematic cross-sectional view of a negative electron affinity device in accordance with the present invention.

FIG. 2 illustrates a negative electron affinity device 110 in accordance with the foregoing strategy and with the present invention. Elements illustrated in FIG. 2, which correspond to the elements described above with respect to FIG. 1, have been designated by corresponding reference numerals increased by one hundred. The embodiments of FIG. 1 and FIG. 2 operate in the same manner unless otherwise stated. A comparison between FIG. 1 and FIG. 2 shows that the doping particles 116 of FIG. 2 are highly concentrated in a narrow band proximate to the CsO layer 118 in contrast to the even dispersion of the doping particles 16, shown in FIG. 1, which are essentially homogeneous within the GaAs layer 14. In FIG. 2, the doping particles 116 are predominantly arranged within the depletion layer 122. The depletion layer 122 is therefore much smaller in FIG. 2 then it is in FIG. 1. This provides the above-described advantages and constitute an aspect of the present invention.

The method of making a device in accordance with the present invention shall now be described. Diffusion is a first method in accordance with the present invention for providing high concentrations of acceptor dopant in a thin layer at the emitter surface. In particular, zinc diffusion gives a high surface concentration with a very abrupt concentration profile (which reduces the doping gradient outside of the depletion layer). Diffusions can be carried out at relatively low temperatures (400°-600° C.) to give thinly doped layers corresponding to typical depletion layer width (~100A). 100A diffusions of zinc require about 25 minutes of exposure at 400° C. Further processing at 400° C. or higher should be avoided with zinc, which is a fast diffuser. The diffusion should occur after the last high temperature process step, or a slower diffusing dopant should be used. Diffusion, per se, is known in the art as can be appreciated by examining the above-noted text which further has an extensive bibliography concerning semiconductor process.

Ion implantation of the acceptor dopant is an alternative to diffusion. Its main advantage is independent control of the depth of implant and the dose (or doping concentration). Like diffusion, ion implantation, per se, is described in the prior art. It is well known to provide selective doping profiles by control of diffusion conditions or by ion-implantation. Ion-implantation forms layers by accelerating impurity ions in an electric field to a high speed. The depth of penetration is determined by the speed before impact. In diffusion the impurity concentration increases in the direction of entrance of the impurities. Ion-implantation allows one to control the impurity profile by varying the acceleration of ions.

Another method is to build in a thin doped layer during crystal growth. This would work best in reflection mode cathodes, because GaAs transmission mode cathodes are usually fabricated by attaching the cathode material and etching the surface where the NEA coating would be applied. It would be difficult to control the etch process precisely enough to leave the thin, highly doped layer required for optimum results. However, for transmission cathodes fabricated by direct deposition of the cathode material, a thin doped layer could be built in during the deposition process.

A photocathode has been described in which the photoresponse is increased by applying higher doping to the emitting surface than to the bulk of the light collecting region. Optimum results should be obtained when the higher doping is confined to the thin depletion region near the emitting surface. Several methods have been described for applying the higher doping.

The present invention is particularly useful in GEN III photocathodes and night vision devices and Negative Electron Affinity photodetectors.

It should be understood that the embodiments described herein are merely exemplary and that a person skilled in the art may make many variations and modifications without departing from the spirit and scope of the invention as defined in the appended claims.

What is claimed:

1. A negative electron affinity device comprises:

(a) a semiconductor layer doped with an electron acceptor dopant, said semiconductor layer having an emitter face from which electrons are emitted; and (b) a coating of material to produce or enhance negative electron affinity deposited over said semiconductor layer emitter face, said coating setting up a depletion band in said semiconductor layer, said dopant having an increased concentration proximate said emitter face substantially within said depletion band.

2. The device of claim 1, wherein said dopant is wholly concentrated within said depletion band.

3. The device of claim 2, wherein said semiconductor is at least one of GaAs, $In_xGa_{1-x}As$, and other material capable of exhibiting negative electron affinity.

4. The device of claim 3, wherein said negative electron affinity coating is CsO.

5. The device of claim 4, wherein said dopant is Zn.

6. In a photoresponsive negative electron affinity device having a semiconductor layer doped with an electron acceptor dopant, said semiconductor layer having an emitter face from which electrons are emitted, and a negative electron affinity coating applied to said emitter face of said semiconductor layer for setting up a depletion band in said semiconductor layer, the improvement therein comprising:

a concentration gradient for said dopant, wherein said dopant is more highly concentrated proximate said emitter face substantially within said depletion band such that the photoresponse of said device is increased.

7. The device of claim 6, wherein said dopant is concentrated wholly within said depletion band, whereby said depletion band is narrowed, and whereby said concentration gradient increases diffusion length of free electrons by decreasing dopant concentration outside said depletion band.

8. The device of claim 7, wherein said semiconductor is GaAs,$In_xGa_{1-x}As$, or other material capable of exhibiting negative electron affinity.

9. The device of claim 8, wherein said negative electron affinity coating is CsO.

10. The device of claim 9, wherein said dopant is Zn.

* * * * *